US011817538B2

(12) United States Patent
Igarashi et al.

(10) Patent No.: US 11,817,538 B2
(45) Date of Patent: Nov. 14, 2023

(54) LAMINATED FILM, LIGHT-EMITTING DEVICE USING THE SAME, AND METHOD FOR MANUFACTURING LIGHT-EMITTING DEVICE

(71) Applicant: STANLEY ELECTRIC CO., LTD., Tokyo (JP)

(72) Inventors: Takahiro Igarashi, Tokyo (JP); Shoko Kasai, Tokyo (JP); Akihiko Hanya, Tokyo (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 38 days.

(21) Appl. No.: 17/748,519

(22) Filed: May 19, 2022

(65) Prior Publication Data
US 2022/0376155 A1     Nov. 24, 2022

(30) Foreign Application Priority Data

May 20, 2021 (JP) .................. 2021-085652

(51) Int. Cl.
| | |
|---|---|
| H01L 33/62 | (2010.01) |
| B32B 7/12 | (2006.01) |
| B32B 15/08 | (2006.01) |
| B32B 15/20 | (2006.01) |
| B32B 27/28 | (2006.01) |

(Continued)

(52) U.S. Cl.
CPC ................ *H01L 33/62* (2013.01); *B32B 7/12* (2013.01); *B32B 15/08* (2013.01); *B32B 15/20* (2013.01); *B32B 27/281* (2013.01); *F21V 19/0015* (2013.01); *B32B 2250/02* (2013.01); *B32B 2255/06* (2013.01); *B32B 2255/26* (2013.01); *B32B 2255/28* (2013.01); *B32B 2307/306* (2013.01); *B32B 2307/412* (2013.01); *B32B 2307/7246* (2013.01); *B32B 2457/08* (2013.01); *H01L 24/13* (2013.01); *H01L 24/16* (2013.01); *H01L 24/81* (2013.01); *H01L 2224/13144* (2013.01); *H01L 2224/16225* (2013.01); *H01L 2224/81815* (2013.01); *H01L 2933/0066* (2013.01)

(58) Field of Classification Search
CPC .......... H01L 33/62; B32B 7/12; B32B 15/08; B32B 15/20; B32B 2250/02; B32B 2250/06; B32B 2250/26; B32B 2250/28; B32B 2307/306; B32B 2307/412; B32B 2307/7246; F21V 19/0015
See application file for complete search history.

(56) References Cited

U.S. PATENT DOCUMENTS

| | | | |
|---|---|---|---|
| 2020/0032026 A1* | 1/2020 | Nakamura | ............... C08J 9/286 |
| 2020/0139674 A1* | 5/2020 | Donelan | ................ B32B 13/02 |

FOREIGN PATENT DOCUMENTS

| | | |
|---|---|---|
| JP | H10235784 A | 9/1998 |
| JP | 4557515 B2 | 7/2010 |

* cited by examiner

*Primary Examiner* — Andrew J Coughlin
*Assistant Examiner* — Jessica M Apenteng
(74) *Attorney, Agent, or Firm* — Holtz, Holtz & Volek PC

(57) ABSTRACT

A laminated film in which a heat-resistant base film and a metal foil are bonded using an adhesive is provided with a barrier layer that prevents chemicals from entering the adhesive layer, between the metal foil and the adhesive layer. The barrier layer is made of a heat-resistant resin similar to that of the base film and has a water absorption rate of 1% or less. The adhesive layer is a silicone-based resin and has a thickness of 40 μm or more after drying.

8 Claims, 5 Drawing Sheets

(51) Int. Cl.
*F21V 19/00* (2006.01)
*H01L 23/00* (2006.01)

LAMINATED FILM, LIGHT-EMITTING DEVICE USING THE SAME, AND METHOD FOR MANUFACTURING LIGHT-EMITTING DEVICE

BACKGROUND OF THE INVENTION

1. Field of the Invention

The present invention relates to a laminated film, in which a metal foil is laminated on a resin film, and particularly relates to a laminated film suitable for a flexible substrate or the like.

2. Description of the Related Art

A laminated film in which a metal foil such as a copper foil is laminated on a transparent film such as polyimide directly or via an adhesive is widely used as a material for a flexible substrate (FPC) or the like. An FPC is used in many electronic components by forming desired wiring patterns and electrodes by etching the copper foil of such a laminated film and soldering components such as semiconductor elements and light-emitting elements.

Laminated films can be broadly divided into those in which a copper foil is laminated on a base film without using an adhesive, and those in which a copper foil is laminated via an adhesive. In both cases, although excellent flexibility and heat resistance are important characteristics, it is necessary to use an appropriate laminated film suitable for manufacturing process of the FPC and the electronic component which is the final product, and the environment in which the electronic component is used. For example, in a light-emitting device equipped with a light-emitting element, transparency is often required for the base film.

Laminated films in which a metal foil is laminated on a transparent film are generally prepared by a technique such as a casting method in which a polyimide resin (varnish before curing) is applied to the metal foil and thermosetting is performed, a thermal laminating method in which a polyimide film and a metal foil are attached using a polyimide resin or thermosetting adhesive, or a sputtering method (for example, JP-B-4557515, JP-A-10-235784, and the like). Among these, the casting method and the thermal laminating method can be conducted with a simpler manufacturing apparatus than the sputtering method and are widely used.

However, in the casting method or the like, when a polyimide layer is formed on a flexible material such as copper foil and cured, if the thickness of the polyimide is 30 μm or more, the polyimide is cured with shrinkage, and therefore, there is a problem that the laminated film is warped together due to the shrinkage stress of the polyimide.

In addition, thermal lamination is temperature-dependent, and in the low-temperature range, peeling occurs at the interface between the metal foil and the base film, and in the high-temperature range, the film or the polyimide used for bonding is partially torn and pinholes and resin lumps may occur.

On the other hand, when a metal foil and a transparent polyimide are bonded together using an adhesive, the adhesive is required to have strong adhesive strength and heat resistance to withstand the use of solder or the like. For example, in JP-A-10-235784, epoxy resins, NBR-phenol resins, phenol-butyral resins, epoxy-NBR resins, epoxy-polyester resins, epoxy-nylon resin, epoxy-acrylic resins, acrylic resins, polyamide-epoxy-phenol resins, polyimide resins, silicone resins, and the like are listed as usable resins.

SUMMARY OF THE INVENTION

Epoxy resins listed in JP-A-10-235784 and resins having a carbon backbone as the main chain, such as urethane resins, have a heat resistant temperature of 200° C. or lower. When soldering an electronic element such as an LED to an FPC, the heat is 230° C. or higher, and even the low temperature for soldering is 180° C. or higher. Therefore, with such an adhesive, the adhesive layer melts or decomposes during soldering. In addition, sufficient strength cannot be guaranteed for applications that require long-term reliability, such as in-vehicle parts. Silicone resins have higher heat resistance than carbon backbone resins but are easily swollen by water. In particular, it tends to swell due to acid-containing water used during wet etching and wet plating. Therefore, when immersed in treatment water during wet etching or wet plating to form a wiring pattern from a metal foil, it swells due to the water, acid, and solvent contained in the treatment solution, the dimensional stability of the film cannot be guaranteed, and the dimensional stability of the wiring pattern formed on the film cannot be guaranteed.

Further, in order to increase the strength and the adhesive strength of the FPC, it is necessary to give the adhesive layer a certain thickness to ensure the adhesive strength, but in that case, the problem caused by the above-mentioned adhesive layer further increases.

An object of the present invention is to provide a laminated film having a structure in which a metal foil and a base film are bonded using an adhesive and which can avoid problems of peeling and tearing during the manufacturing of the laminated film and has high heat resistance, dimensional stability, and long-term reliability.

The present invention solves the above problems by using a laminated film having a four-layer structure including a barrier layer having a low water absorption rate.

That is, the laminated film of the present invention is a laminated film in which a metal foil is laminated on a heat-resistant film via an adhesive layer, and a barrier layer made of a resin having a water absorption rate (JIS: K7209: 2000) of 1% or less and acid resistance is included between the metal foil and the adhesive layer. In an aspect of the laminated film of the present invention, a highly heat-resistant silicone-based adhesive is used as the adhesive layer. In addition, polyimide is used as the barrier layer.

Further, the light-emitting device of the present invention uses a flexible substrate in which a wiring pattern is formed on the metal foil of the above-mentioned laminated film.

The method for manufacturing a light-emitting device of the present invention includes a step of forming a wiring pattern on the metal foil of the above-mentioned laminated film by wet etching and a step of bonding terminals of a light-emitting element on the wiring pattern via a conductive adhesive.

The present invention can provide a laminated film, which has a four-layer structure in which a barrier layer is interposed between the metal foil and the adhesive layer, thereby reducing the peeling and tearing of the film and has a high heat resistance and long-term reliability without causing a dimensional change due to swelling even when a silicone-based adhesive is used as the adhesive layer.

DESCRIPTION OF THE PREFERRED EMBODIMENTS

Hereinafter, embodiments of the laminated film of the present invention will be described.

Figure 1:
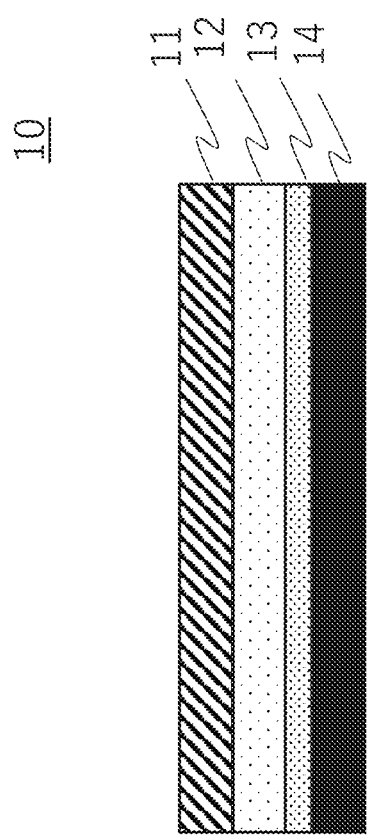
FIG. 1 is a cross-sectional view showing an embodiment of a laminated film of the present invention.

As shown in FIG. 1, a laminated film 10 of the present embodiment is a laminated film having a structure in which a heat-resistant base film 11 and a metal foil 14 are bonded together with an adhesive, and a barrier layer 13 having low water absorption is interposed between the adhesive layer 12 and the metal foil 14.

As the base film 11, a resin having heat resistance to a temperature of 200° C. or higher, specifically, polyimide, polycarbonate, polyamide, polyester, a liquid crystal polymer, or the like can be used but a polyimide film is particularly suitable from the viewpoint of heat resistance, flexibility, and acid resistance. The base film may be required to be transparent in applications such as light-emitting devices, but in applications where transparency is not required, a colored film (for example, Kapton (trade name): colored polyimide, and the like) may be used.

The thickness of the base film 11 is not limited, but when used for FPC, it is preferably used in the range of 10 to 50 μm. With such a thickness, high flexibility can be obtained and the occurrence of warpage when laminated can be reduced.

The adhesive layer 12 is preferably a silicone-based adhesive from the viewpoint of adhesive strength, heat resistance, flexibility, and the like. The silicone-based resin basically has a polysiloxane structure in which a functional group such as an alkyl group is bonded to silicon but a silicone resin to which a phenyl group is partially bonded, an epoxy-modified silicone resin, or the like may be used. When a silicone-based adhesive is used, the thickness of the adhesive layer 12 is preferably 40 μm or more as a dry thickness. By setting the thickness to 40 μm or more, sufficient adhesive strength can be obtained while maintaining flexibility.

The barrier layer 13 is a layer that functions as a moisture barrier with respect to the adhesive layer 12 and is composed of a resin having a low water absorption rate. The water absorption rate is 1% or less, preferably 0.9% or less. The water absorption rate can be measured according to JIS: K7209:2000. Specifically, after immersing a test piece made of a resin constituting the barrier layer in distilled water at 23° C. for a predetermined time (24 hours), the water absorption rate can be found as a value (%) obtained by dividing the change in mass of the test piece (difference from the initial mass) by the initial mass.

By providing the barrier layer 13 having such a low water absorption rate between the metal foil 14 and the adhesive layer 12, when the metal foil 14 is wet-etched or wet-plated, it is possible to prevent the treatment solution used in those treatments from entering the adhesive layer 12, prevent the adhesive layer 12 from swelling, and ensure dimensional stability. As the resin constituting such a barrier layer 13, for example, a material having the same heat resistance as the resin constituting the base film 11 and the adhesive layer 12 and obtaining high adhesive strength with the adhesive layer 12 is preferable. As the resin having such a low water absorption rate, specifically, the same resin material as the base film 11, polyimide, polycarbonate, polyamide, polyester, liquid crystal polymer, and the like can be used and the polyimide resin is particularly preferable.

The thickness of the barrier layer 13 is preferably 3 μm or more in order to form a stable barrier layer and is preferably 20 μm or less in order not to cause warpage due to the barrier layer 13 in the laminated film. The thickness is more preferably 5 to 15 μm, still more preferably 5 to 13 μm.

The metal foil 14 is generally a copper foil but is not limited to a copper foil and an aluminum foil, stainless foil, nickel foil and the like can also be used if it is a conductive metal that can be laminated with a base film via an adhesive and can form a wiring pattern by etching. The metal foil 14 usually has a thickness of 12 to 35 μm.

FIG. 1 shows a laminated film composed of four layers of the base film 11, the adhesive layer 12, the barrier layer 13, and the metal foil 14, but if necessary, a layer (easy-adhesive layer) for increasing the adhesiveness between the base film 11 and the adhesive layer 12 may be provided, or the surface of the base film 11 may be subjected to an easy-adhesive treatment. Further, in the drawing, a laminated film in which the metal foil 14 or the like adheres to one side of the base film 11 is shown, but it is also possible to laminate the metal foil 14 or the like on both sides, and such a laminated film is also included in the present invention.

Next, an example of the method for manufacturing the laminated film of the present embodiment will be described.

Figure 2:
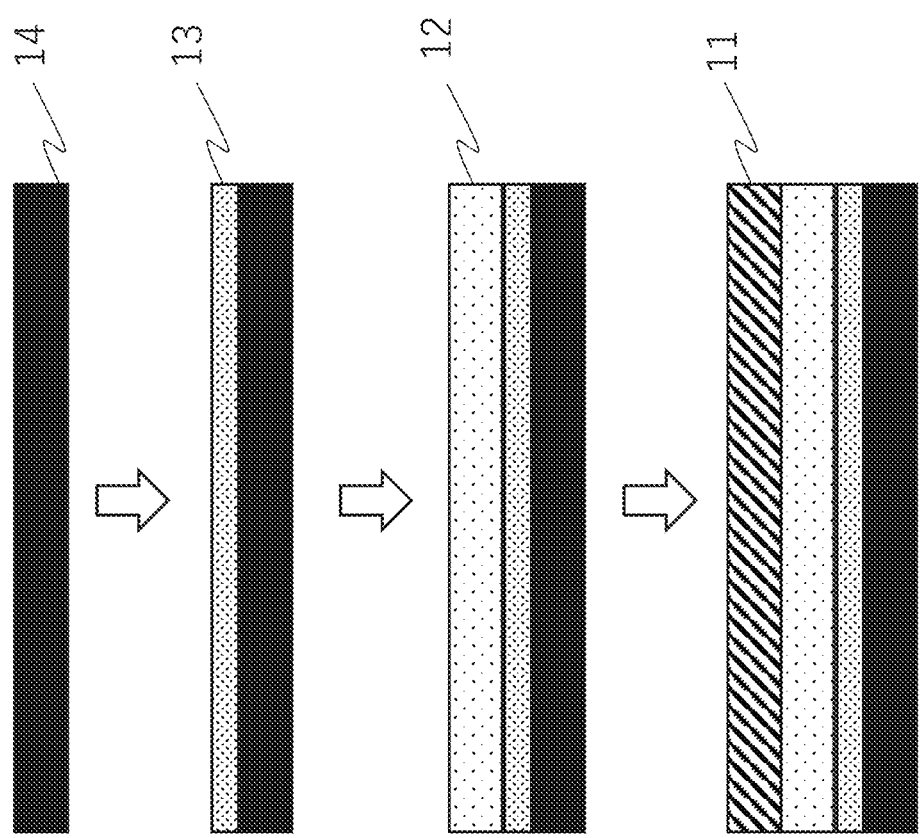
FIG. 2 is a diagram showing an example of a method for manufacturing the laminated film.

As shown in FIG. 2, a resin constituting the barrier layer 13 is liquefied by adding a solvent and the obtained resin (varnish) is uniformly applied onto the metal foil 14 and dried by heating to form a transparent barrier layer 13. For coating, a general coating method such as die coating, spin coating, bar coating, or spray coating can be used, and a barrier layer having a wet thickness of 20 μm or less and a dry thickness of 5 to 20 μm is formed. The drying condition of the barrier layer is, for example, a low oxygen condition in which the oxygen concentration is 100 ppm or less, and the temperature is increased stepwise, for example, for 30 minutes at 100° C. and 30 minutes at 300° C. while raising the temperature at a heating rate of 5° C./min.

An adhesive composition containing a silicone resin is applied onto the barrier layer 13 so as to have a wet thickness of 50 to 60 μm. As the coating method, the same method as the varnish coating of the barrier layer can be used. Immediately after the adhesive composition is applied, a transparent base film (thickness 25 to 50 μm) is attached thereto and the adhesive composition is vacuum-bonded and dried. Alternatively, bonding by pressurization is also possible. For example, pressurization is performed at 120° C. and 1 N/mm² for 30 minutes, and then drying is performed at 150° C. for 30 minutes under the atmospheric pressure. By heating and curing stepwise in this way, it is possible to prevent the generation of voids in the adhesive layer.

By the above steps, a laminated film having a four-layer structure in which the metal foil 14 and the base film 11 are laminated via the barrier layer 13 and the adhesive layer 12 can be obtained.

However, the method for producing the laminated film of the present invention is not limited to the above-mentioned manufacturing method. For example, it is also possible to produce a laminate of the metal foil 14 and the barrier layer 13 and apply an adhesive composition onto the base film 11, and then attach the laminate so that the barrier layer 13 is in contact with the adhesive-applied surface.

As described above, since the barrier layer 13 having a low water absorption rate is disposed between the metal foil 14 and the adhesive layer 12, even if the laminated film of the present invention is exposed to an etching treatment solution such as the aqueous iron(III) chloride solution or an aqueous sodium hydroxide solution during etching of the metal foil of the laminated film of the present invention, the adhesive layer 12 is prevented from absorbing water in the treatment solution and swelling. Further, after etching, the adhesive layer 12 is exposed, but even when wet plating or the like is performed in a later process, the invasion of water from the acid (aqueous solution) such as hydrochloric acid or sulfuric acid used in the wet plating and the accompanying swelling can be prevented.

Similar to a general metal foil laminated film, the laminated film of the present invention can be used for a substrate for a light-emitting device used for in-vehicle lighting equipment and general lighting, a flexible substrate for electronic devices such as wearable devices, a flexible cable, a planar heating element, electromagnetic shield materials, and the like, and for each application, highly reliable products can be obtained and reliability can be maintained even when exposed to a high temperature or high humidity environment for a long time.

Next, an embodiment of a light-emitting device will be described as an example of a product using the laminated film of the present invention. Here, as an example, a case where the metal foil 14 is a copper foil, the base film 11 is polyimide, the adhesive layer 12 is an adhesive layer made of a silicone resin, and the barrier layer 13 is polyimide will be described.

Figure 3:
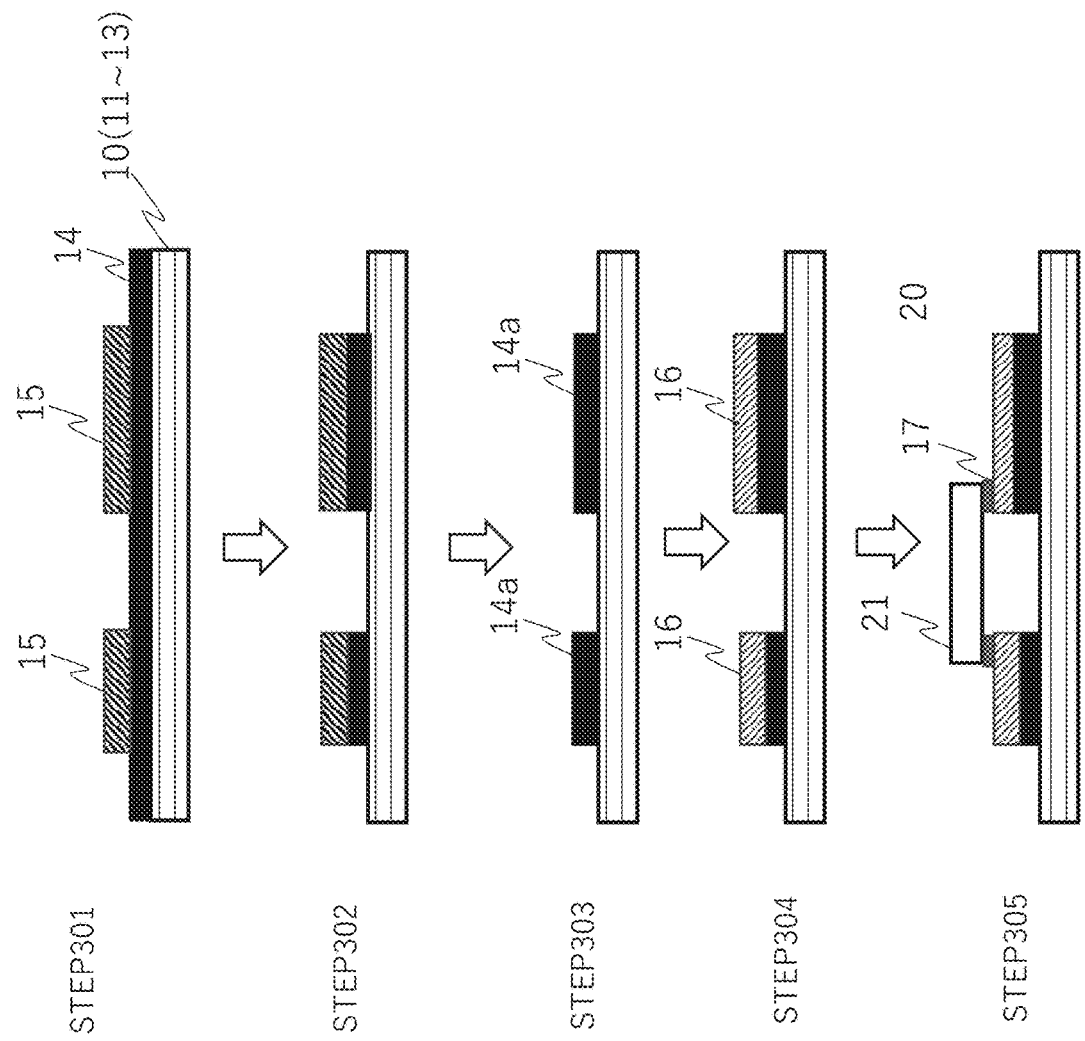
FIG. 3 is a diagram showing an example of a method for manufacturing a light-emitting device using the laminated film of the present invention.

As shown in FIG. 3, in a light-emitting device 20 of the present embodiment, a predetermined wiring pattern 14a is formed on the copper foil 14 of the laminated film 10 by wet etching. The wet etching is carried out by applying a mask 15 such as a photoresist to the copper foil (step 301), and then immersing the copper foil in an etching solution such as an acid (for example, aqueous iron(III) chloride solution) or an alkali (for example, sodium hydroxide aqueous solution) that corrodes the copper foil for a predetermined time (step 302). At this time, by removing the copper foil, the barrier layer underneath is exposed, but since the barrier layer is made of a resin having a low water absorption, the moisture in the etching solution is prevented from penetrating through the barrier layer to the adhesive layer under the barrier layer, and the swelling of the adhesive layer 12 made of a silicone-based resin is suppressed.

After that, the mask 15 remaining on the wiring pattern is removed (step 303), and if necessary, Ni, Au, and the like are attached to a part or all of the copper foil remaining as the wiring pattern by a technique of electroplating or electroless plating to form a plating layer (step 304). In the case of electroless plating, for example, after performing acid degreasing treatment, acid cleaning with sulfuric acid or hydrochloric acid, Pd activation treatment using an activator, the electroless nickel plating using an electroless nickel plating solution (ICP Nicolon, and the like), the substitution Au plating and the reduction Au plating using the initial make-up solution, and the like are performed. In this way, during plating, the laminated film containing the wiring pattern is immersed in various treatment solutions for several tens of seconds to several tens of minutes, but again, the barrier layer prevents the moisture in the treatment solution from penetrating into the adhesive layer and suppresses the swelling of the adhesive layer and the accompanying changes in the dimensions of the laminated film.

Next, solder 17 is applied to a position where an electronic component 21 such as an LED element or a light-receiving element (hereinafter referred to as a chip) of a wiring pattern is mounted (for example, a feeding point formed by an Au bump or the like), and a chip having a feeding terminal on the back surface (SMD chip) 21 is soldered and fixed by reflow (step 305). The illustrated example shows a representative state where one chip 21 is fixed, but a plurality of chips may be fixed. Although the case where the chip 21 is fixed by soldering is shown in FIG. 3, it is also possible to use Ag nanoparticles as a bonding material, apply pressure from the chip side, and perform bonding by direct bonding in which a pulse is applied.

In the completed light-emitting or light-receiving device, the heat-resistant base film 11, the adhesive layer 12, and the barrier layer 13 are laminated in this order from the side opposite to the side on which an LED element or a light-receiving element is mounted, and the wiring pattern 14a is formed thereon. An LED element or a light-receiving element is mounted on the wiring pattern 14a and the barrier layer 13 is exposed in the gap of the wiring pattern 14a.

The light-emitting device 20 manufactured in this way can prevent the adhesive layer from coming into direct contact with these chemicals even if the FPC is exposed to various chemicals in each step of its manufacture. Therefore, even when a silicone resin that can be easily swollen due to moisture is used as an adhesive layer, it is possible to obtain a light-emitting device having a stable shape while maintaining its high heat resistance and adhesive strength. Further, in the manufactured light-emitting device, the adhesive layer for bonding the wiring pattern of the FPC and the base film is a silicone resin, and the surface thereof is protected by the barrier layer. Thus, even if the light-emitting device is left in a harsh environment of high temperature and humidity for a long time, the long-term reliability of the light-emitting device can be maintained without being invaded.

EXAMPLE

Hereinafter, examples of the laminated film of the present invention will be described.

Example 1

A transparent polyimide varnish (Neopulim S100: manufactured by Mitsubishi Gas Chemical Company) was applied onto a copper foil (thickness 35 μm) with a wet thickness of 105 μm and a coating length of 270 mm using a die coater having a coating width of 200 mm. Next, in a low oxygen atmosphere ($O_2$ concentration: 100 ppm or less), the mixture was dried at 100° C. for 30 minutes, then heated to 300° C. at a heating rate of 5° C./min, and further dried for 30 minutes to form a barrier layer made of polyimide. The thickness of the barrier layer after drying was 10 μm.

Next, a silicone resin (dimethyl silicone resin: manufactured by Shin-Etsu Chemical Co., Ltd.) was applied to the polyimide barrier layer formed as described above with a wet thickness of 58 μm and a coating length of 270 mm using a die coater having a coating width of 200 mm. Immediately after applying the silicone resin, a transparent polyimide single film (thickness: 50 μm) is attached, heated at 60° C. for 4 hours, then heated to 150° C. at a heating rate of 2° C./min, and dried for another 4 hours to manufacture a copper foil-polyimide film laminate. As the transparent polyimide single film, the same material as the transparent polyimide varnish used for the barrier layer was made into a film.

The thickness of the adhesive layer (silicone resin layer) in the obtained laminate was 40 μm.

Comparative Example 1

A copper foil-polyimide film laminate is manufactured by using the same copper foil and transparent polyimide single film as in Example 1 and boding both together with the same silicone resin as in Example 1 without providing a barrier layer.

Comparative Example 2

The same copper foil as in Example 1 is prepared, and a transparent polyimide varnish (Neopulim S100: manufactured by Mitsubishi Gas Chemical Company) is applied with a wet thickness of 280 μm and a coating length of 270 mm using a die coater having a coating width of 200 mm so that it has the same thickness (50 μm) as the transparent polyimide single film of Example 1. Next, in a low oxygen atmosphere ($O_2$ concentration: 100 ppm or less), the mixture was dried at 100° C. for 30 minutes, then heated to 300° C. at a heating rate of 5° C./min, and dried for another 30 minutes to manufacture a copper foil-polyimide film laminate.

<Evaluation>

The following items were evaluated for the laminates of Example 1 and Comparative Examples 1 and 2.

Occurrence of warpage and curl: After the bonding was completed, it was visually confirmed whether or not the flat shape was maintained.

Adhesive strength: The adhesive strength (N/cm) was measured by a 90-degree peel test of C5016:1994.

The total light transmittance Tt was measured using a transparency ultraviolet-visible spectrophotometer (UH4150, manufactured by Hitachi High-Tech Science).

Solvent resistance: The laminate was immersed in an electroless nickel plating solution (ICP Nicolon, and the like) for 45 minutes and the presence or absence of peeling was confirmed.

Figure 4:
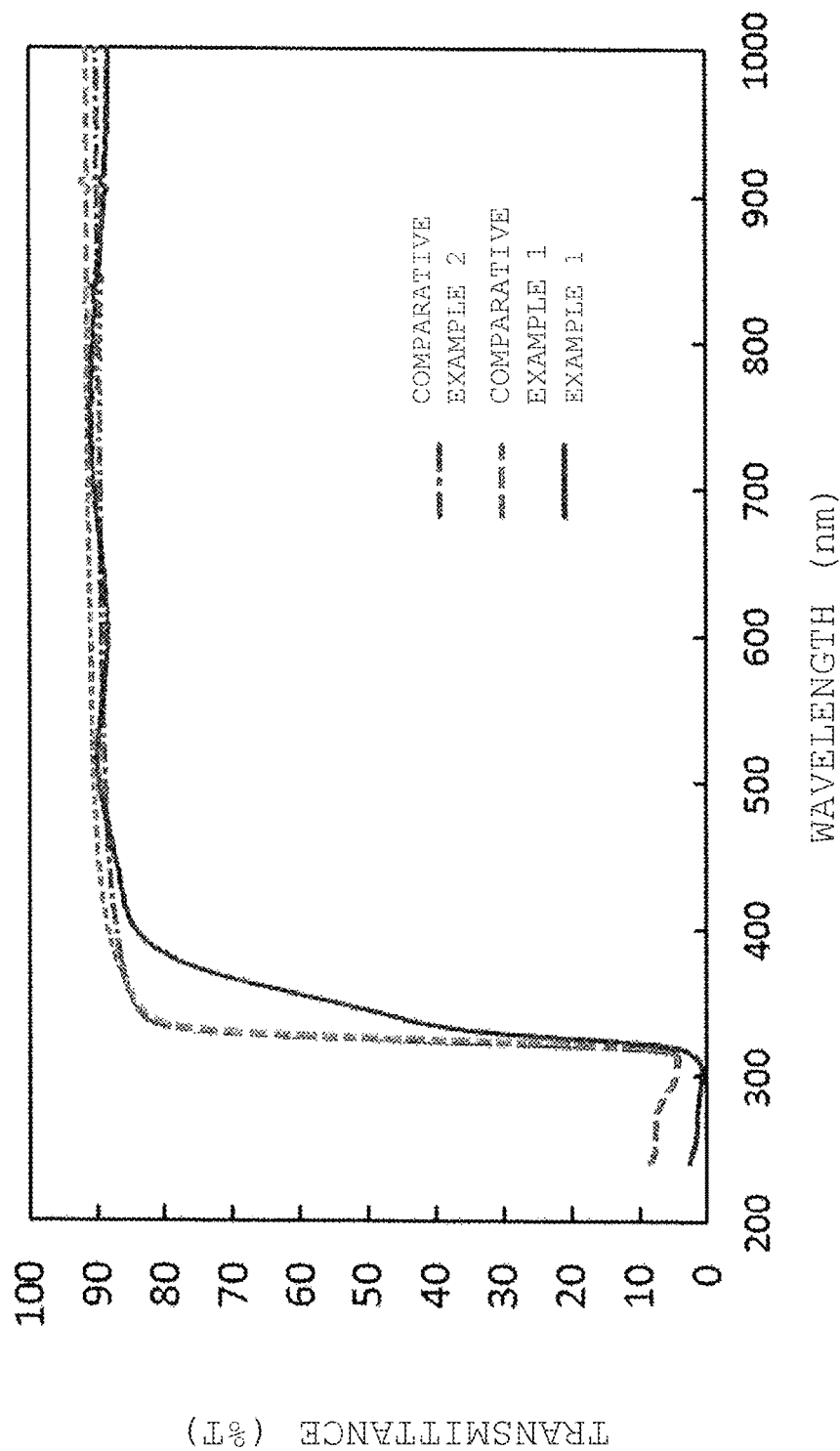
FIG. 4 is a diagram showing the total light transmittance of the laminated films of Examples and Comparative Examples.

The results are shown in Table 1. Regarding the transparency, the results are shown in FIG. 4 and Table 1 shows only the value of the transparency at a wavelength of 445 nm.

TABLE 1

|  | Example | Comparative Example 1 | Comparative Example 2 |
|---|---|---|---|
| Occurrence of curl | None | None | Warpage occurred |
| Adhesive strength (N/cm) | 9.5 | 10 | No peel |
| Transmittance: 445 nm (%) | 87.08 | 89.82 | 88.35 |
| Solvent resistance | No peel | Peel | No peel |

As shown in Table 1, in Example 1 and Comparative Example 1, no warpage or curl (curled state) occurred, but in Comparative Example 2, warpage occurred due to the effect of curing shrinkage of the resin at the time of bonding. Comparative Example 2 had the strongest adhesive strength, but it is observed that Example 1 and Comparative Example 1 obtain a sufficient adhesive strength of 9 (N/cm or more) when used as a laminated film. Regarding the solvent resistance, in Comparative Example 1 having no barrier layer, the silicone adhesive layer was deteriorated by the plating treatment solution, and the adhesive strength was lowered.

Regarding the transparency, as shown in FIG. 4, although the transmittance of Example 1 having a barrier layer is slightly lower than that of Comparative Example 1 having no barrier layer, the transmittance is 85% or more at a wavelength of 445 nm, so that it is confirmed that the performance as a material for mounting blue LEDs and the like is sufficient.

Example 2

In the step of forming the barrier layer of Example 1, copper foil-polyimide film laminates each having a dry thickness of the barrier layer of 20 μm (Experimental Example 1), 25 μm (Experimental Example 2), and 35 μm (Experimental Example 3) were manufactured in the same manner as in Example 1 except that the coating amount of the transparent polyimide varnish is changed.

When these laminates were evaluated in the same manner as in Example 1, the same results as in Example 1 were obtained for all items other than curl, but in Experimental Examples 2 and 3, the laminate became tubular after lamination. From this result, it was found that the thickness of the barrier layer is preferably less than 25 μm, and more preferably 20 μm or less.

Example 3

In the step of forming the adhesive layer of Example 1, a copper foil-polyimide film laminate having a different thickness of the adhesive layer was manufactured in the same manner as in Example 1 except that the coating amount of the silicone resin is changed, and the adhesive strength of the adhesive layer (90-degree peel test) was measured. The results are shown in FIG. 5.

Figure 5:
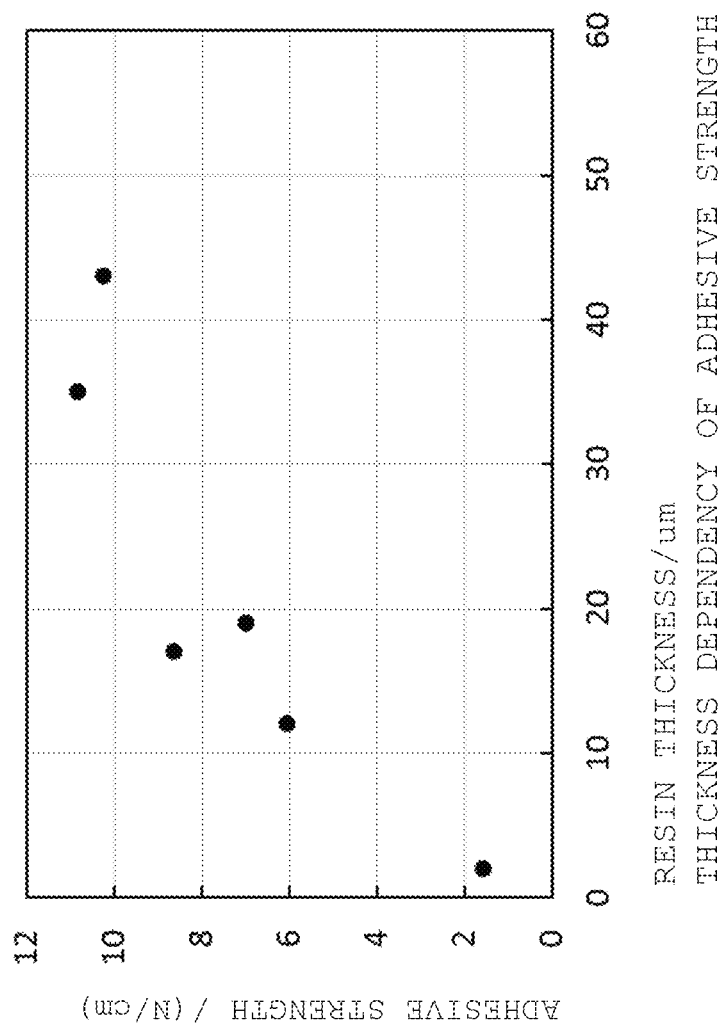
FIG. 5 is a graph showing the relationship between the thickness of the adhesive layer and the peeling strength in Example 2.

As can be seen from the results of FIG. 5, a sufficient adhesive strength cannot be obtained when the thickness of the adhesive layer is 2 μm, but an adhesive strength of 6 N/cm or more is obtained when the thickness is 10 μm or more, and adhesive strength of 10 N/cm is obtained when the thickness of the adhesive layer is 35 μm or more. From this result, it was found that the thickness of the adhesive layer using the silicone resin is preferably 35 μm or more.

What is claimed is:

1. A flexible laminated film comprising:
   a metal foil laminated on a heat-resistant film via an adhesive layer; and
   the laminated film comprising:
   a barrier layer made of a resin having a water absorption rate (JIS: K7209:2000) of at most 1%, the barrier layer being provided between the metal foil and the adhesive layer,
   wherein the metal foil has a wiring pattern for mounting a light-emitting element thereon.

2. The laminated film according to claim 1, wherein the resin constituting the barrier layer comprises a polyimide resin.

3. The laminated film according to claim 2, wherein the heat-resistant film comprises a light-transmitting polyimide film.

4. The laminated film according to claim 2, wherein the adhesive layer comprises a silicone-based adhesive having a thickness equal to or greater than 40 µm, and the barrier layer comprises polyimide resin having a thickness equal to or less than 20 µm.

5. The laminated film according to claim 4, wherein the barrier layer, which has the thickness equal to or less than 20 µm and comprises the polyimide resin, is formed by drying by heat a wet polyimide varnish.

6. The laminated film according to claim 5, wherein the polyimide resin is formed under a low oxygen condition in which an oxygen concentration is 100 ppm or less when drying the wet polyimide varnish.

7. A light-emitting device comprising:
a flexible substrate of the flexible laminated film according to claim 1; and electronic components mounted on the wiring pattern.

8. A light-emitting device comprising:
a flexible substrate of the flexible laminated film according to claim 1; and
a light-emitting element mounted on the wiring pattern.

* * * * *